(12) United States Patent
Bareket

(10) Patent No.: US 6,462,818 B1
(45) Date of Patent: Oct. 8, 2002

(54) OVERLAY ALIGNMENT MARK DESIGN

(75) Inventor: Noah Bareket, Saratoga, CA (US)

(73) Assignee: KLA-Tencor Corporation, San Jose, CA (US)

( * ) Notice: Subject to any disclaimer, the term of this patent is extended or adjusted under 35 U.S.C. 154(b) by 194 days.

(21) Appl. No.: 09/603,120

(22) Filed: Jun. 22, 2000

(51) Int. Cl.[7] ............................. G01B 11/27; G03F 9/00
(52) U.S. Cl. ......................... 356/401; 356/400; 430/22
(58) Field of Search ................................... 356/399, 400, 356/401; 355/53, 55; 430/17, 22, 30; 250/548

(56) References Cited

U.S. PATENT DOCUMENTS

| | | |
|---|---|---|
| 4,475,811 A | 10/1984 | Brunner |
| 4,538,105 A | 8/1985 | Ausschnitt |
| 4,703,434 A | 10/1987 | Brunner |
| 4,714,874 A | 12/1987 | Morris et al. |
| 4,757,207 A | 7/1988 | Chappelow et al. |
| 4,778,275 A | 10/1988 | van den Brink et al. |
| 4,782,288 A | 11/1988 | Vento |
| 4,820,055 A | 4/1989 | Müller |
| 4,855,253 A | 8/1989 | Weber |
| 4,929,083 A | 5/1990 | Brunner |
| 5,017,514 A | 5/1991 | Nishimoto |
| 5,112,129 A | 5/1992 | Davidson et al. |
| 5,148,214 A | 9/1992 | Ohta et al. |
| 5,156,982 A | 10/1992 | Nagoya |
| 5,172,190 A | 12/1992 | Kaiser |
| 5,216,257 A | 6/1993 | Brueck et al. |
| 5,262,258 A | 11/1993 | Yanagisawa |
| 5,296,917 A | 3/1994 | Kusonose et al. |
| 5,383,136 A | 1/1995 | Cresswell et al. |
| 5,414,514 A | 5/1995 | Smith et al. |
| 5,436,097 A | 7/1995 | Norishima et al. |
| 5,438,413 A | 8/1995 | Mazor et al. |

(List continued on next page.)

OTHER PUBLICATIONS

US 5,841,144, 11/1998, Cresswell (withdrawn)
Harry J. Levinson, "Lithography Process Control", Bellingham, Washington USA, Tutorial Texts in Optical Engineering vol. TT28, SPIE Optical Engineering Press, pp. 96–107.
Giovanni Rivera et al., "Overlay Performance on Tungsten CMP Layers Using the ATHENA Alignment System", STMicroelectronics in Agrate, Agrate Brianza, Italy.
Chungwei Hsu, Ron Chou, Tsu–Wen Hwang, "Charaterizing lens distortion to overlay accuracy by using fine measurement pattern", Mar. 1999, Santa Clara, Calif., Part of the SPIE Conference on Metrology, SPIE vol. 3677.

Primary Examiner—F. L. Evans
Assistant Examiner—Zandra Smith
(74) Attorney, Agent, or Firm—Beyer Weaver & Thomas LLP

(57) ABSTRACT

A mark comprising at least one set of calibration periodic structures and at least two sets of test periodic structures, both types of which are positioned along an axis. The mark is used to measure the relative position between two layers of a device. Each set of test periodic structures has its periodic structures formed within first and second sections. The periodic structures of the first and second sections are each formed on one of the two layers of the device, respectively. The first and second sections of each test set is positioned proximate to the second and first sections of the next test set, respectively. This mark allows two beams which scan the mark to travel over both a test section formed on one layer of the device and a test section formed on the other of the two layers. Scanning multiple test sets provides multiple registration error values which are then averaged to obtain an average registration error value. Another aspect of the present invention is directed towards a method for measuring the relative position between two layers of a device. The method begins by providing a mark as described above. A beam is scanned in a first path across the mark. A beam is then scanned in a second path across the mark. Signals are generated with respect to the portion of each beam which reflects off the surface of the device so that the registration error between the two layers may be calculated.

32 Claims, 6 Drawing Sheets

U.S. PATENT DOCUMENTS

| | | |
|---|---|---|
| 5,477,057 A | 12/1995 | Angeley et al. |
| 5,479,270 A | 12/1995 | Taylor |
| 5,498,501 A | 3/1996 | Shimoda et al. |
| 5,596,413 A | 1/1997 | Stanton et al. |
| 5,617,340 A | 4/1997 | Cresswell et al. |
| 5,627,083 A | 5/1997 | Tounai et al. |
| 5,665,495 A | 9/1997 | Hwang |
| 5,699,282 A | 12/1997 | Allen et al. |
| 5,701,013 A | 12/1997 | Hsia et al. |
| 5,702,567 A | 12/1997 | Mitsui et al. |
| 5,703,685 A | 12/1997 | Senda et al. |
| 5,712,707 A | 1/1998 | Ausschnitt et al. |
| 5,757,507 A | 5/1998 | Ausschnitt et al. |
| 5,766,809 A | 6/1998 | Bae |
| 5,783,342 A | 7/1998 | Yamashita et al. |
| 5,805,290 A | 9/1998 | Ausschnitt et al. |
| 5,835,196 A | 11/1998 | Jackson |
| 5,857,258 A | 1/1999 | Penzes et al. |
| 5,872,042 A | 2/1999 | Hsu et al. |
| 5,877,036 A | 3/1999 | Kawai |
| 5,877,861 A | 3/1999 | Ausschnitt et al. |
| 5,902,703 A | 5/1999 | Leroux et al. |
| 5,912,983 A | 6/1999 | Hiratsuka |
| 5,923,041 A | 7/1999 | Cresswell et al. |
| 5,939,226 A | 8/1999 | Tomimatu |
| 5,949,145 A | 9/1999 | Komuro |
| 5,968,693 A | 10/1999 | Adams |
| 6,020,966 A | 2/2000 | Ausschnitt et al. |
| 6,023,338 A | 2/2000 | Bareket |
| 6,077,756 A | 6/2000 | Lin et al. |
| 6,079,256 A | 6/2000 | Bareket |
| 6,118,185 A | 9/2000 | Chen et al. |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,140,217 A | 10/2000 | Jones et al. |
| 6,146,910 A | 11/2000 | Cresswell et al. |
| 6,160,622 A | 12/2000 | Dirksen et al. |
| 6,165,656 A | 12/2000 | Tomimatu |

OVERLAY ALIGNMENT MARK DESIGN

CROSS-REFERENCE TO RELATED APPLICATION

This application is related to commonly assigned U.S. Pat. No. 6,023,338, entitled "Overlay Alignment Measurement of Wafers," which is hereby incorporated by reference in its entirety.

FIELD OF THE INVENTION

The present invention relates generally to the testing of semiconductor wafers during the production of the wafer. More specifically, the present invention relates to the use of a new alignment pattern to determine the registration accuracy between two patterned layers on a semiconductor wafer.

BACKGROUND

One of the most critical process control techniques used in the manufacturing of integrated circuits is the measurement of overlay accuracy between successive, patterned layers on a wafer (i.e., the determination of how accurately a patterned layer aligns with respect to the layer above or below it).

Presently this measurement is done with test patterns that are etched into the layers. The relative displacement is measured by imaging the patterns at high magnification on an electronic camera using any of a variety of known image analysis algorithms. The most commonly used patterns are concentric squares with dimensions of approximately 20 micrometers on each side, generally referred to as "box within a box" target. FIG. 1 illustrates a typical "box" type target 5. Inner box 1 is typically printed on the top layer of the semiconductor wafer being produced, while the open-center-outer block 2 is printed on the second layer down on the semiconductor wafer. The measurement process thus involves imaging of target 5 on an electronic camera, by means of a microscope system, at a high magnification (1000×, typically) and with high resolution in both x and y directions.

The registration error in each of the x and y axes is measured by first calculating the locations of the edges of lines c1 and c2 of the outer box 2, and the edge locations of the lines c3 and c4 of the inner box 1. The registration error represents the amount of misalignment between the two layers which are being tested. From those locations the registration error between the two boxes is determined by comparing the average separation between lines c1 and c3 with the average separation between lines c4 and c2 (i.e., the registration error between boxes 1 and 2 is the difference between those two separations). The registration error between boxes 1 and 2 in each axis is thus calculated using the following formulas:

$$R_x = (c_x 3 - c_x 1) - (c_x 2 - c_x 4) \quad (1a)$$

and $$R_y = (c_y 3 - c_y 1) - (c_y 2 - c_y 4) \quad (1b)$$

Thus, if the average spacing between lines c1 and c3 is the same as the average spacing between lines c2 and c4, the corresponding value of R in that axis will be zero.

This prior art is further described and analyzed by Neal T. Sullivan, "Semiconductor Pattern Overlay", in Handbook of Critical Dimensions Metrology and Process Control, pp. 160–188, vol. CR52, SPIE Press (1993). The accuracy of the prior art is limited by the asymmetry of etched line profiles, by aberrations in the illumination and imaging optics, and by image sampling in the camera. It would be desirable to have a system that overcomes the limitations of the prior art.

SUMMARY

The present invention is directed to an apparatus and a method for measuring the relative position between two layers of a device. In one embodiment of the invention, the two layers are stacked layers in a semiconductor wafer. The apparatus uses a mark which includes at least one set of calibration periodic structures and at least two sets of test periodic structures, both types of which are positioned along an axis. Each set of test periodic structures has its periodic structures formed within first and second sections. The periodic structures of the first and second sections are each formed on one of the two layers of the device, respectively. The first and second sections of each test set are positioned proximate to the second and first sections of the next test set, respectively. This mark allows two beams which scan the mark to travel over both a test section formed on one layer of the device and a test section formed on the other of the two layers. Scanning multiple test sets provides multiple registration error values which are then averaged to obtain a registration error value that is minimally affected by asymmetries between the two beams used in the measurement process and/or asymmetries between the different layer characteristics (e.g., differences in height and/or differences in material composition between test sets of the two measured layers). The registration error represents the amount of misalignment between the two layers which are being tested.

Another aspect of the present invention is directed towards a method for measuring the relative position (e.g., alignment) between two layers of a device. The method begins by providing a first set of calibration periodic test structures and providing at least two sets of test periodic structures which have a structure similar to that of the mark described above. A beam is then scanned in a first path across portions of the calibration periodic structures and the sets of test periodic structures. A beam is then scanned in a second path across portions of the calibration periodic structures and the sets of test periodic structures. Signals are generated with respect to the portion of the beams which reflect off the surface of the device so that the registration error between the two layers in a specific direction may be calculated. This process may then be repeated in order to calculate the registration error between the two layers in a separate direction. Preferably, an average registration error is calculated between the two layers for each direction.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
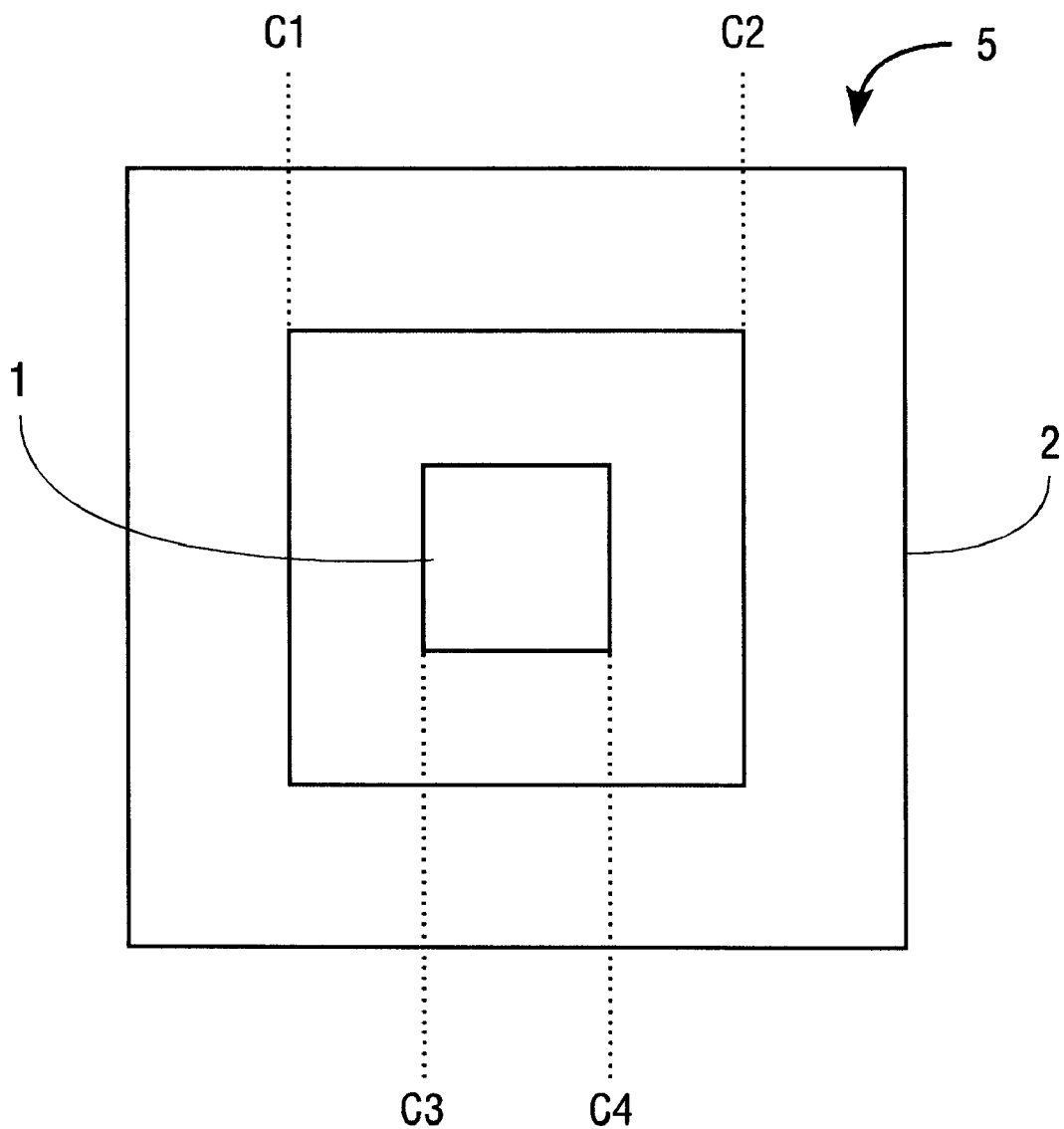
FIG. 1 illustrates a typical prior art "box in a box" target.
Figure 2:
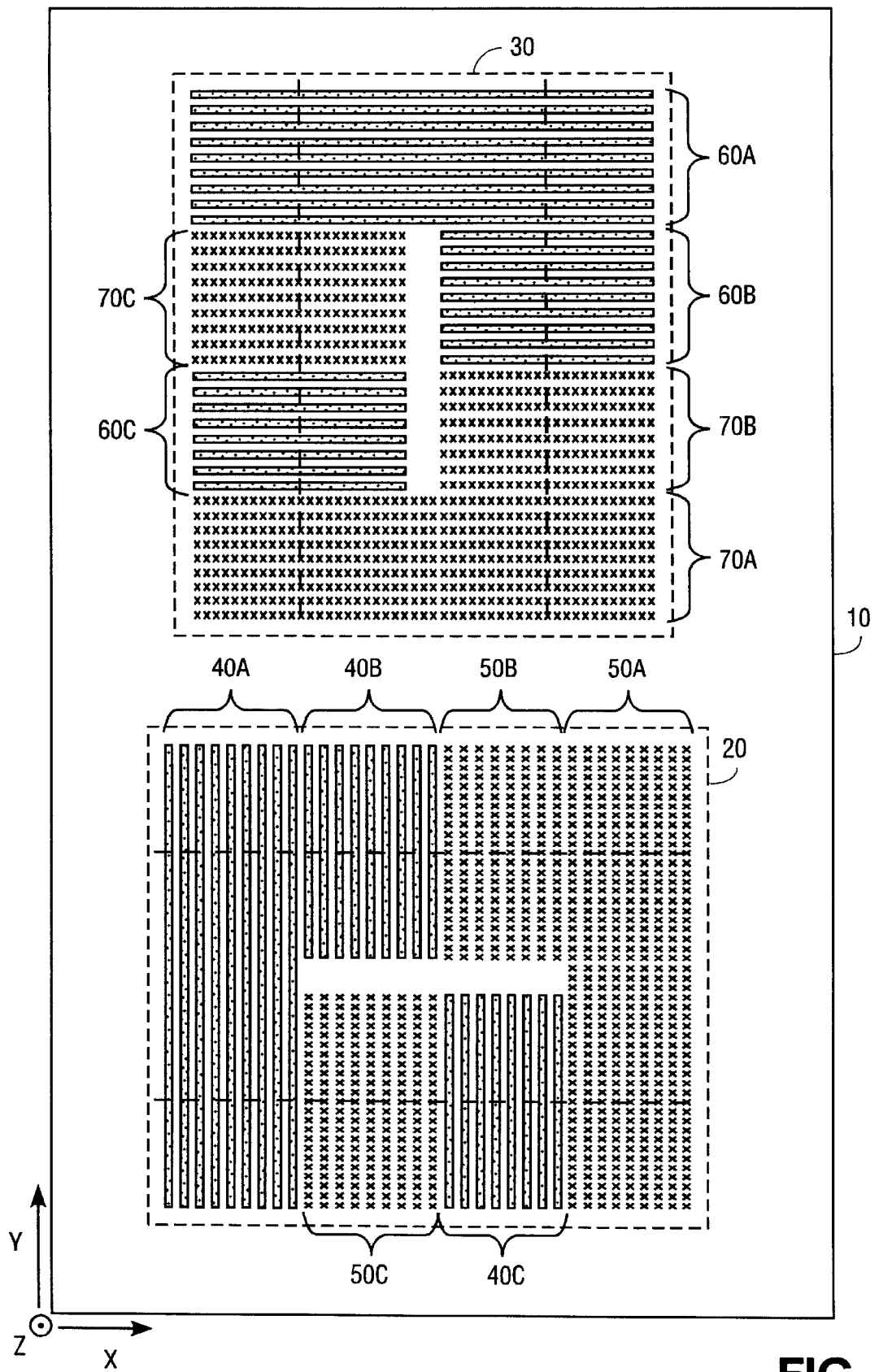
FIG. 2 illustrates an embodiment of the mark of the present invention used to determine the alignment of two layers of a semiconductor wafer.

The present invention, in each of the various embodiments, uses a mark that is composed of periodic structures on each of two layers of a semiconductor device to provide relative position information between those two layers of the semiconductor device. Those structures are produced by suitable lithographic techniques, and in the simplest application constitute etched or deposited lines of an equal width to the distance between the lines, forming a periodic grating as shown in FIG. 2 and discussed in more detail below. One embodiment of the periodic structures (see FIG. 2) consists of equally spaced lines having essentially a rectangular profile with the lines arranged so that there is no overlap between the portions of the periodic structure contributed by each of the two layers. The lines from each layer of the semiconductor device appear side by side in the periodic structure. While a rectangular profile is presented in FIG. 2, it is not essential for operation, and other line profiles, trapezoidal or rounded, could alternatively be used. Additionally, while the patterns for both the x and y-directions are shown to be proximate to each other, they could be in different locations of the semiconductor wafer. The mark configurations of the present invention contribute to various embodiments of a comprehensive alignment measuring instrument for overlay semiconductor layers that are discussed below.

FIG. 2 shows a periodic structure in the form of alignment pattern 10. Alignment pattern 10 is shown to be in a configuration which results when the tested layers of wafer 100 are in proper alignment with each other. Alignment pattern 10 includes two substantially identical grating patterns, 20 and 30, translated 90 degrees with respect to each other. Given the axis orientation markings in FIG. 2, grating 20 is for x-axis registration measurements, while grating 30 is for y-axis measurements since the lines of the respective grating typically have to be non-parallel to the axis of the measurement to be effective. The user can choose any convenient orientation of the marks relative to the placement of the dies on the wafer with that orientation being the same for the masks from layer to layer. Additionally, any number of marks may be present on the wafer at various orientations to each other for measuring alignment in different directions. Alternatively, the wafer may include a single mark for measuring misalignment in a single direction.

Each of the gratings 20 and 30, as shown in FIG. 2, consist of six sets of periodic structures. Specifically, the periodic structures are solid, parallel line segments where the width of each line is equal to the spacing between the line segments. In actual use, the configuration of the line. width to spaces will vary, depending on the required accuracy. However, the relationship between the line widths and spaces will typically be the minimum line width on the semiconductor wafer. In a specific implementation of test pattern, line spacing of approximately 1 um may be used and accuracy within 3–5 nm may be obtained.

Directing attention to grating 20 for illustration, the solid line segments 40a, 40b and 40c are etched on one layer of the semiconductor wafer, while the "xx"-patterned line segments 50a, 50b and 50c are etched on a subsequent layer of the semiconductor wafer. Line segments 40a and 50a are full length line segments that are the outer line segments of the grating contributed by each of the semiconductor wafer layers, while the substantially half length line segments 40b, 40c, 50b and 50c make up the inner region of the periodic grating with each set contributed by a respective layer of the semiconductor wafer. In grating 30, line segments 60a, 60b and 60c are shown corresponding to, and being on the same layer of the semiconductor wafer as lines 40a, 40b and 40c in grating 20. Similarly, in grating 30, line segments 70a, 70b and 70c are shown corresponding to, and being on the same layer of the semiconductor wafer as lines 50a, 50b and 50c in grating 20. This is for illustration here and need not be matched in this way in actual use (i.e., line segments 40a, 40b and 40c and 70a, 70b and 70c might be on the same layer, while line segments 50a, 50b, 50c, 60a, 60b and 60c might be on the other layer). Also, each full length line within 40a, 50a, 60a and 70a may be formed as substantially equal half line segments.

Note that in FIG. 2, the number of lines within each grouping of line segments is dependent on the resolution required and on the signal-to-noise ratio desired. From the perspective of the minimum number of each length of lines that is needed for operation, that number is two "a", two "b" and two "c" lines being contributed by each of the two consecutive layers of the semiconductor wafer for each of gratings 20 and 30, respectively (i.e., two 70a lines, two 70b lines, two 70c lines, two 60a lines, etc.). One factor affecting the maximum number of lines that may be used within a group of line segments is the state of semiconductor fabrication technology. Currently, up to approximately twelve lines per group of line segments is preferable. However, in the near future, it is foreseeable that many more lines may be formed within each group of line segments.

Note additionally, that if the "xx"-patterned lines are formed on the first layer of the semiconductor wafer with the solid lines on the second layer, alignment between the first and second layer line sets may then be measured. After the alignment measurements for the first and second layers are taken, another set of lines on the third layer (shown here in "xx"-pattern) are formed over, and covering, the region of lines 50a, 50b and 50c of the first layer. Then alignment between the lines 40a, 40b and 40c of the second layer and the lines 50a, 50b and 50c on the third layer is measured. This procedure may then be repeated for additional layers (e.g., a fourth layer formed over the second layer lines). Thus, each set of lines on a layer of the semiconductor wafer (except for those on the first and last layers) are used in conjunction with the lines on two layers of the semiconductor wafer, the one below and the one above. Alternatively, if there is sufficient space on the semiconductor wafer surface, the grating pairs for each pair of adjacent layers on the wafer could be in a different location on the wafer to minimize any "bleed through" interference to measurement layers from buried layers that are not currently being measured.

Thus, given this mark configuration, the registration error between the two layers of the semiconductor wafer in the x-direction may be determined by measuring the amount of juxtaposition between the lines of 50b, 50c, 40b and 40c in the mark 20. Similarly, in the mark 30, any registration error in the y-direction will be present between the juxtaposed lines of 60b, 60c, 70b and 70c. Specifically, in mark 30, a first registration error is measured between line set 60c from the second layer and line set 70b from the first layer. A second registration error is measured between line set 70c from the first layer and line set 60b from the second layer.

Figure 3:
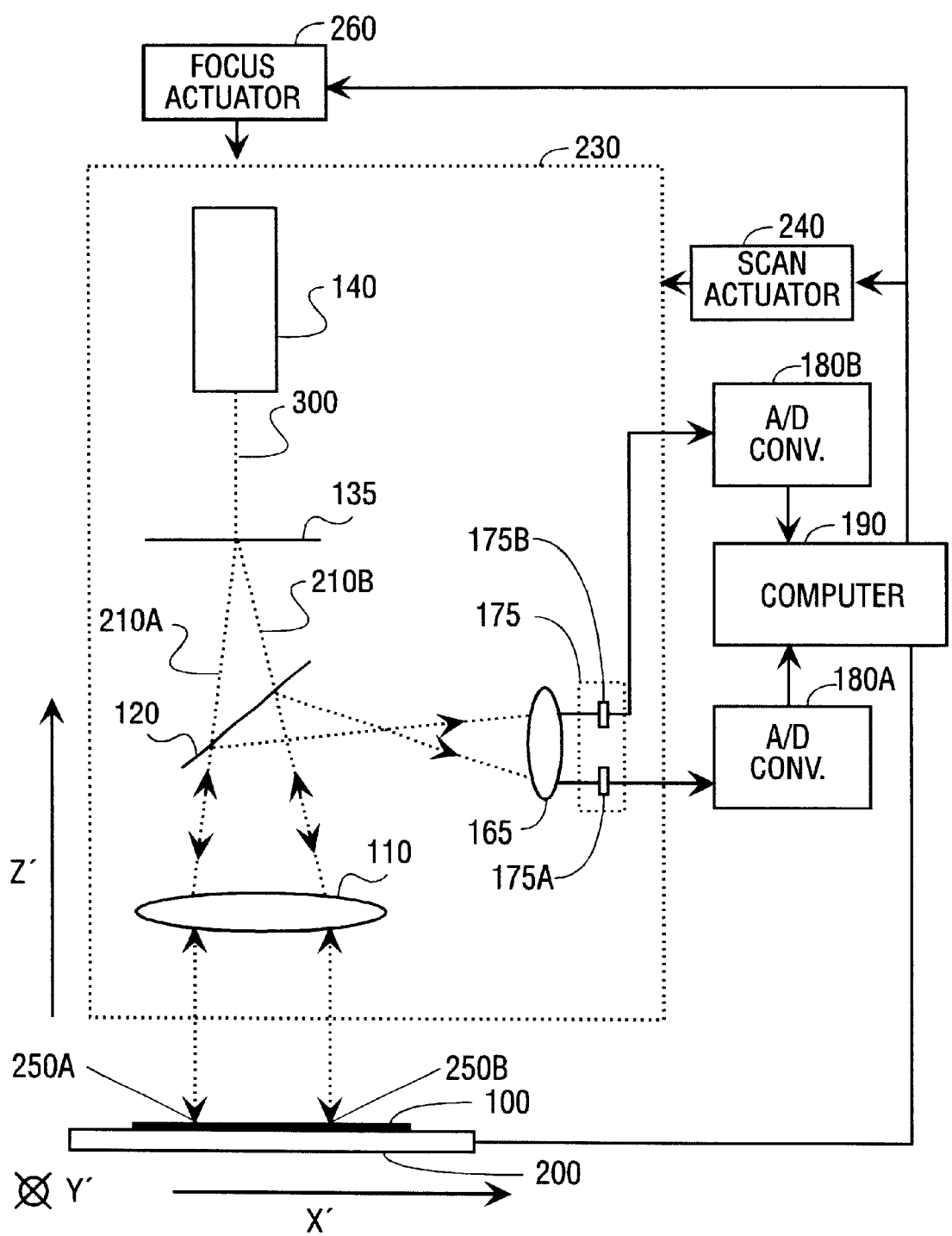
FIG. 3 illustrates an embodiment of an alignment measuring system of the present invention.

FIG. 3 is a diagram of one embodiment of an alignment scanner that utilizes an alignment pattern, such as the alignment pattern 10 discussed with respect to FIG. 2. In this embodiment, wafer 100 with the pattern thereon being measured is placed on stage 200 which is typically motor driven under the control of system computer 190 with scan head 230 provided to perform the actual measurements with computer 190 also performing the actual calculations from the data received from scan head 230. There are two options with respect to providing scanning motion between wafer 100 and scan head 230. One is to move stage 200 relative to scan head 230 by computer 190, and the other is to move scan head 230 by computer 190 via scan actuator 240 (e.g., a piezoelectric actuator) relative to stage 200. While either technique can be used, it is preferred to move scan head 230 and hold stage 200 stationary since the scan head can be made much smaller in size and weight relative to the wafer positioning stage. Alternatively, scanning can be implemented by moving the whole head, or by moving only some of the optical components.

Before proceeding with the discussion of the construction and operation of the alignment scanner in FIG. 3, there are a few definitions to be addressed. In FIG. 3, there are two coordinate systems that define the measurement geometry. One is the coordinate axes of wafer 100 which are referred to as x, y and z (see FIG. 2). The other is the coordinate axes of scan head 230 relative to wafer 100 which is referred to here as x', y' and z', which are as indicated in FIG. 3.

As shown in FIG. 3, the x' axis is horizontal and in the plane of the figure, the z' axis is vertical and in the plane of the figure, and the y' axis (the axis of measurement) is perpendicular to and into the plane of the figure. Thus, in this specific example, the measurement is being made on grating 30 (see FIG. 2). Initially wafer 100 is placed on stage 200 and stage 200 is then aligned by rotating stage 200 so that the x- and y- directions of gratings 20 and 30 on wafer 100 are substantially parallel to x' and y' axes of scan head 230. If the two axes systems are not exactly aligned, then an imaginary line drawn between the measurement path of the two illuminated spots will not be parallel to the axis that is not being measured on wafer 100. The spots are the points where an alignment scanning beam is incident upon the alignment grating. When this imaginary line is not parallel to the axis not being measured, one spot will be slightly advanced along the axis of measurement with respect to the other in the grating pattern being used to measure alignment. When the two axes systems are not exactly aligned, then the misalignment may be referred to as the system-wafer offset.

The optical part of the system of FIG. 3 incorporated within scan head 230 includes light source 140 that directs a beam of light 300 to a diffraction grating 135 where the light is split into two light beams 210a and 210b. One suitable light source may be a diode laser. Several embodiments of an electron microscope are described in U.S. Pat. No. 6,023,338, which is herein incorporated by reference.

The diffraction grating 135 may be composed of equally spaced lines of opaque coating on a glass substrate, creating a common optical element that is known as a Ronchi Ruling. A discussion of the properties of such a grating can be found in *Modern Optical Engineering* by Warren J. Smith, McGraw-Hill, 1990, page 154. The first diffraction orders are separated by an angle $\alpha$, given by the equation $\sin \alpha = 2\lambda/S$, where $\lambda$ is the illumination wavelength and S is the grating period. The two first diffraction orders are used to provide the two illumination beams 210a and 210b.

Figure 4:
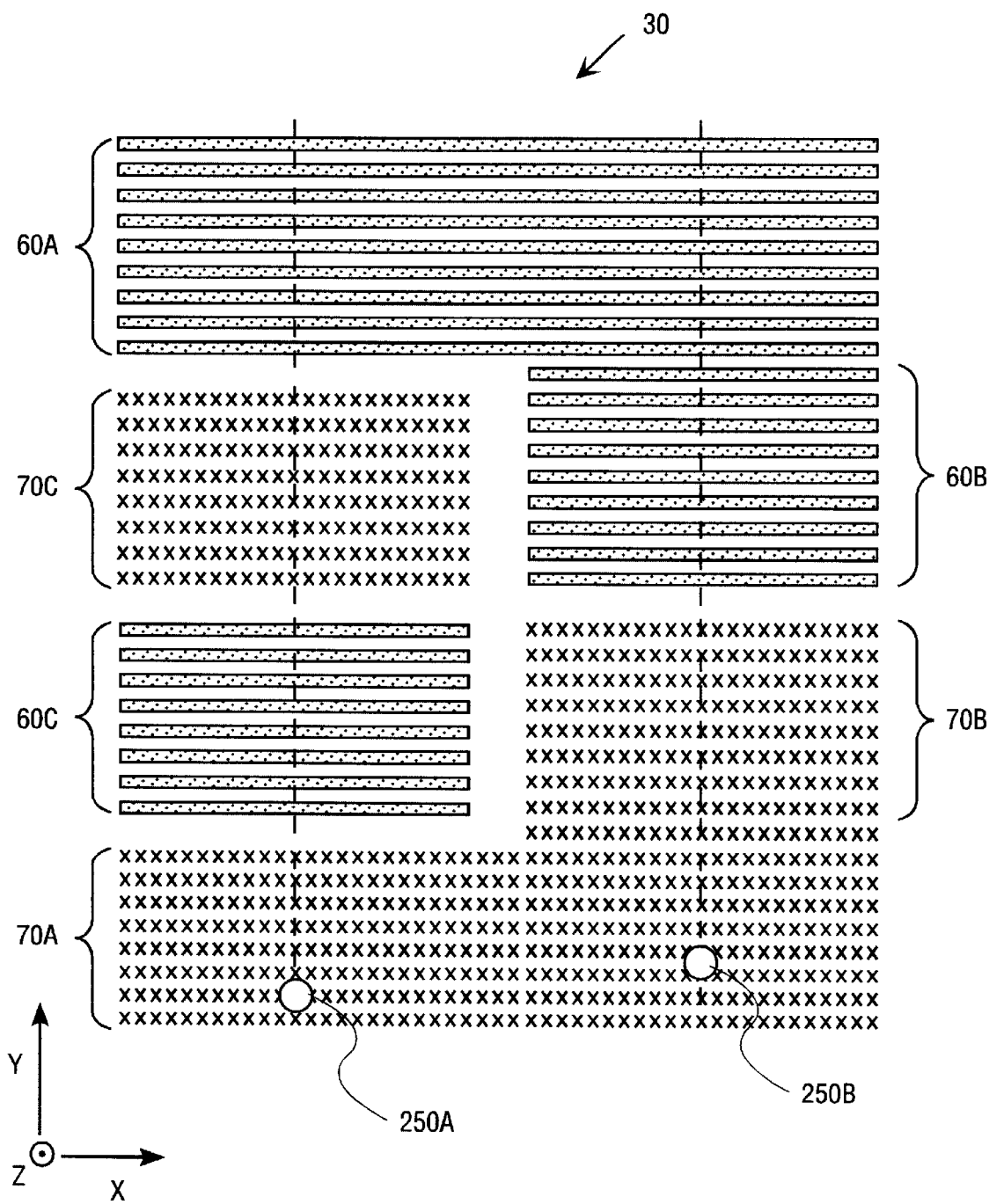
FIG. 4 illustrates an embodiment of an alignment measurement system of the present invention using a mark of the present invention that is perpendicular to the y-axis with an instantaneous position of two light beams used for measurement of alignment in the y-direction.

Light beams 210a and 210b in turn are directed through a first beam splitter 120 that is designed to transmit and reflect light in about equal parts with the two transmitted light beams directed to lens 110 (e.g., a single element or multiple element lens) where the two transmitted light beans are focused by lens 110 at spots 250a and 250b, on grating 30 on wafer 100, as shown in FIG. 4.

The reflected light from each of spots 250a and 250b on wafer 100 is then collected by lens 110, impinges on the first beam splitter 120 where the light is directed substantially 90 degrees towards detector 175. To separate the two beams they are imaged by lens 165 on detector 175, which comprises two detecting elements, 175a and 175b, as shown in FIG. 3. The non-diffracted zero order light is focused in between the detector elements and does not interfere with the measurement. The signals of each element are digitized by the corresponding A/D converter (180a and 180b), and acquired by computer 190. The phase difference between the two signals is then determined by computer 190 as discussed below in relation to FIGS. 4 and 5. The registration error between two layers of the film stack is directly proportional to the misalignment between the portions of the grating pattern on each of the consecutive layers of the wafer 100 in the direction in which the measurement was made.

The measurement precision is also dependent on the intervals at which the signals are sampled by the A/D converters. The sampling interval S (i.e., the distance the spot moves between consecutive samples, in units of length) is calculated as:

$$S = Scanspeed/Frequency \qquad (2)$$

Typically, with a scan speed of 10 mm/sec, and digitizing frequency of 1,000,000 samples/sec, the sampling interval is 10 nm with the measurement precision getting better as the sampling interval decreases.

To initially focus the light beams on spots 250a and 250b, scan head 230 can be moved in the z-direction under the control of computer 190 by focus acuator 260 to physically raise and lower scan head 230 as necessary. Also, to measure the x-axis of wafer 100, a second optical system could be employed. Wafer 100 could be rotated 90 degrees relative to light beams 250a and 250b or scan head 230 could be rotated through 90 degrees. The second measurement along the x'-axis may then be made using grating 20 in the same way as described above for the y'-axis. Typically, scan head 230 is moved with respect to wafer 100 rather than moving stage 200 because the optical scan head can be made to be much smaller and lighter than stage 200. Several embodiments of the optical scanner, as well as alternative alignment scanners, are described in the above referenced U.S. Pat. No. 6,023,338.

Figure 5:
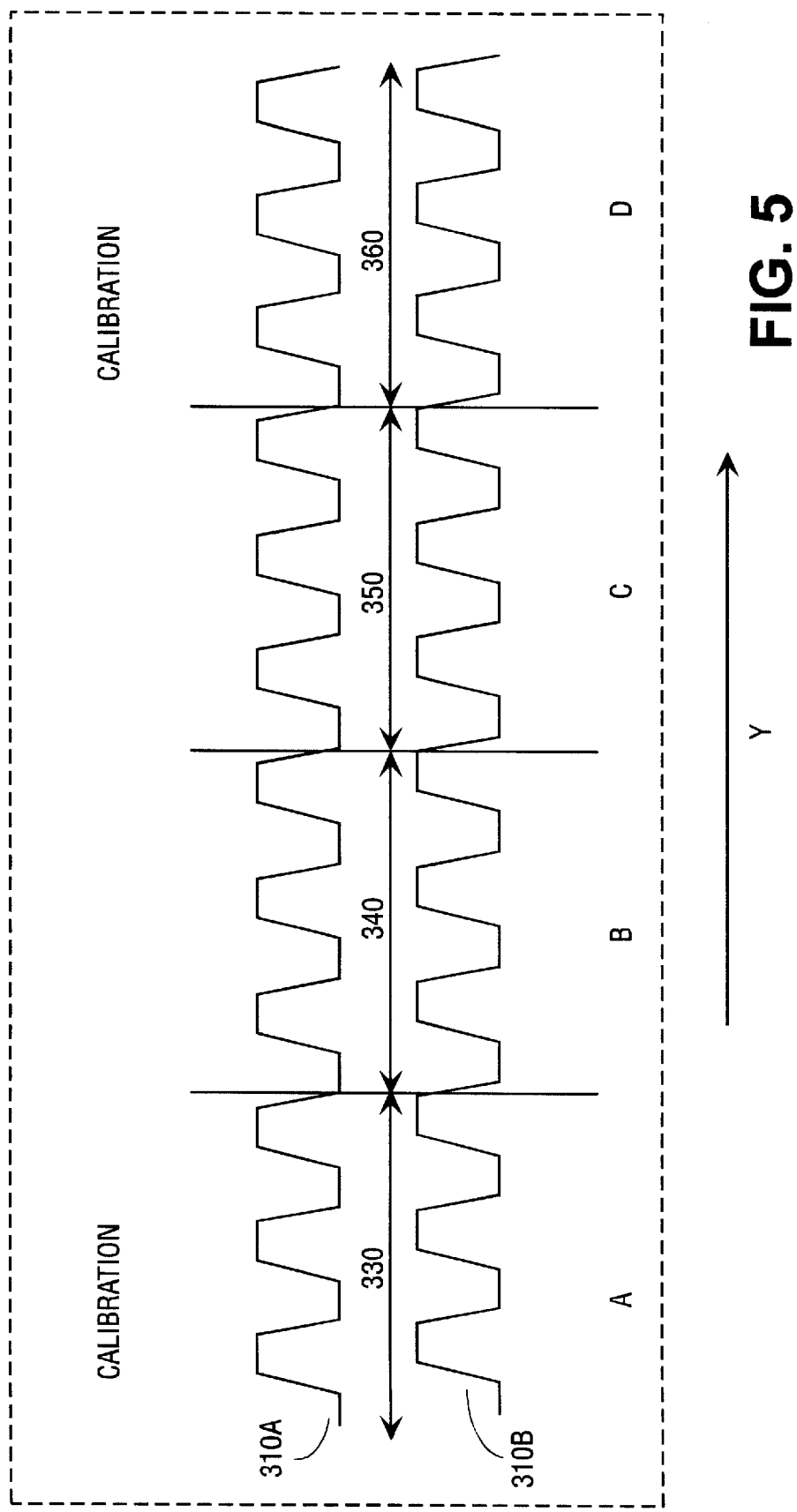
FIG. 5 illustrates in time and position the relationship of the signals developed by each of the scanned light beams in FIG. 4.

The waveforms that are generated by the measurement process described above are presented in FIG. 5. The waveform 310a corresponds to the output of the digitizer 180a (FIG. 3), and the waveform 310b corresponds to the output of digitizer 180b (FIG. 3). The vertical axis in FIG. 5 represents the magnitude of the detected light, and the horizontal axis represents elapsed time. Since the scan rate is essentially constant, the elapsed time is proportional to the scan distance, so that the horizontal axis also represents position in the scan direction.

To illustrate how the misalignment between the two layers on wafer 100 is determined, waveforms 310a and 310b in FIG. 5 are drawn for such a misalignment, as well as an offset between the axes of wafer 100 (x, y, and z) and the axes of scan head 230 (x', y' and z'). The following discussion requires reference to both FIGS. 4 and 5 simultaneously. In FIG. 5 waveforms 310a and 310b are shown in relation to each other as scan head 230 is advanced across wafer 100 (here moved along the y-axis). Those waveforms are all shown divided into four segments 330, 340, 350 and 360. Segment 330 represents the signals obtained by scanning lines 70a (see FIG. 4), segment 340 represents the signals obtained by scanning lines 70b and 60c, segment 350 represents the signals obtained by scanning lines 60b and 70c, and segment 360 represents the signals obtained by scanning lines 60a.

The first segment 330 of signals 310a and 310b is a first calibration segment since both signals correspond to a time when both illumination points, 250a and 250b, impinge on lines 70a of mark 30, as the scan head is translated in the positive y-direction. In segment 330 the relationship of spots 250a and 250b with respect to the measurement axis can be determined since there is no alignment error between lines 70a (e.g., the offset of the axes of the first layer of semiconductor wafer 100 and scan head 230 can be determined with that portion of the grating contributed by the first layer of the semiconductor wafer).

The second segment 340 is a measurement segment since each of signals 310a and 310b are contributed by the scanning of a portion of the two gratings contributed by two layers of semiconductor wafer 100 (e.g., spot 250a impinges on lines 60c of the second layer and spot 250b impinges on line 70b of the first layer).

The third segment 350 is a second measurement segment since each of the signals 310a and 310b are also contributed by the scanning of a portion of the two gratings contributed by two layers of semiconductor wafer 100 (i.e., spot 250a impinges on lines 70c of a first layer and spot 250b impinges on lines 60b of a second layer).

The fourth segment 360 of signals 310a and 310b is a second calibration segment since both signals are obtained from lines 60a on a second layer of wafer 100 (i.e., both signals correspond to a time when both illumination points, 250a and 250b impinge on lines 60a as scan head 230 is translated in the positive y-direction). In segment 360 the relationship of spots 250a and 250b with respect to the measurement axis can be determined since there is no alignment error between the lines 60a (i.e., the offset of the axes of the second layer of semiconductor wafer 100 and scan head 230 can be determined with that portion of the grating contributed by the second layer of the semiconductor wafer).

The calculations performed by computer 190 consist of a determination of the phase differences during the four segments 330, 340, 350 and 360. The phase differences during segments 330 and 360 can be due to the previously explained imperfect rotational alignment of the pattern on wafer 100 and the axes of scan head 230 which produces the different coordinates of illumination points 250a and 250b with respect to the actual axis of wafer 100 in the direction that it is being scanned. Other sources of measurement error that can produce a fixed phase difference between the illumination points are electrical delays and optical aberrations.

The first step in determining the y-axis registration error between the two layers of wafer 100 is to obtain the average phase error between the waveforms 310a and 310b during segments 340 and 350. The second step is to subtract the offset error of the same waveforms obtained from scanning the calibration segments 330 and 360. This adjusted and averaged registration error is then the actual registration error between two layers of wafer 100.

The registration error is calculated by $D=P*\phi$, where P is the grating period and $\phi$ is the calibrated phase difference between the two signals, which is given by:

$$\phi = 0.5(\phi_c - \phi_b) - 0.5(\phi_a \phi_d)$$

The parameters of this equation are defined as:

$\phi_a$ = the phase difference between signals 310a and 310b during interval 330;

$\phi_b$ = the phase difference between the same signals during interval 340;

$\phi_c$ = the phase difference between the same signals during interval 350; and $\phi_d$ = the phase difference between the same signals during the interval 360.

In these equations, the phase is expressed as a fraction of the period, so a phase of one is equal to one period.

In the present invention, two testing segments are provided so that each illumination point, 250a and 250b, will scan over a grating pattern formed on each of the layers between which any registration error is to be measured. For example, in FIG. 4, illumination point 250a will pass over the lines of 60c, which are formed on one layer, and the lines of 70c, which are formed on a different layer; similarly, illumination point 250b will pass over the lines of 70b and 60b, which are formed on each of the two layers of wafer 100. By guiding the illumination spots over two testing segments, the registration error between the two layers is measured twice. The registration error is measured the first time in the first test segment where illumination spot 250a travels over lines formed on the second layer (60c) and spot 250b travels over lines formed on the first layer (70b). When the registration error is measured the second time in the second test segment, spot 250a travels over lines formed in the first layer (70c) and spot 250b travels over lines formed in the second layer (60b). An average registration error is obtained by averaging these two registration error values.

Averaging the two measured registration error values results in substantially reducing measurement errors introduced by asymmetries between the lines formed on the different layers of the wafer and between the two measuring beams. As a result, the average registration error value is more accurate than either of the individually measured registration error values. Asymmetries in the measurement may arise from differences between the height of the different line sets from each layer. The lower layer lines are sometimes visible only through the upper layer of the wafer since the upper layer material covers and conforms to the lines in the lower layer. On the other hand, the upper lines are generally formed from the photoresist mask applied on top of the lower layer. The height difference between the lines of the two layers is between the top of the photoresist and the top of the lower layer material. This height difference may cause an asymmetry in the measurements due to the fact that the light intensity within a cross-sectional area of the bean (the cross-sectional area being perpendicular to the direction in which the beam travels) varies as the beam travels from the beam source. The light modulation caused by the lines of the two layers may vary since each segment of lines impinges each beam at a different height, thereby causing different shapes of diffraction. This asymmetrical effect may cause inaccuracies in the collected data (i.e., waveforms 310a and 310b). It should also be noted that each beam may have different inherent aberrations which cause slight shifts in the intensity distributions within the beams. Another source of asymmetry is that the beams may have different refractive characteristics as they impinge upon a metal layer versus upon photoresist material.

The above mentioned causes of asymmetry are the main examples of what are intended to be accounted for when the two registration error values are averaged. As may be appreciated by those of skill in the art, more than two test segments may be included in order to increase the amount of test data available for averaging. Also, the test segments do not need to be positioned adjacent to each other. This method of obtaining an averaged registration error value may then be repeated for grating 20 in order to obtain the registration error in the x-direction.

Methods for computing the phase difference, or time shift between two waveforms are well established, including Fourier transform algorithms, zero-crossing detection, cross-correlation algorithms and others. In some cases it may be desirable to make several scans, either at the same x-coordinate, or at different x-coordinates. Several scans are desirable to reduce measurement noise since averaging several measurements tends to reduce statistically random noise. Assuming that a scanning is in the y-axis (as described before and indicated in the figure), it is desirable to move the scan line along the x-axis direction so that localized imperfections in the grating structure (which are statistically random) can be averaged. For each scan the registration error is computed in each of segments 330 and 360, and then an average is taken of those values. Computing the registration error and then averaging the registration error is preferable to averaging the intensity values of each sample point since errors due to vibration cancel out when the samples are taken within a small part of the single cycle of the predominant vibration frequency. From experience, these vibration frequencies when present are typically well below 500 hertz.

Figure 6:
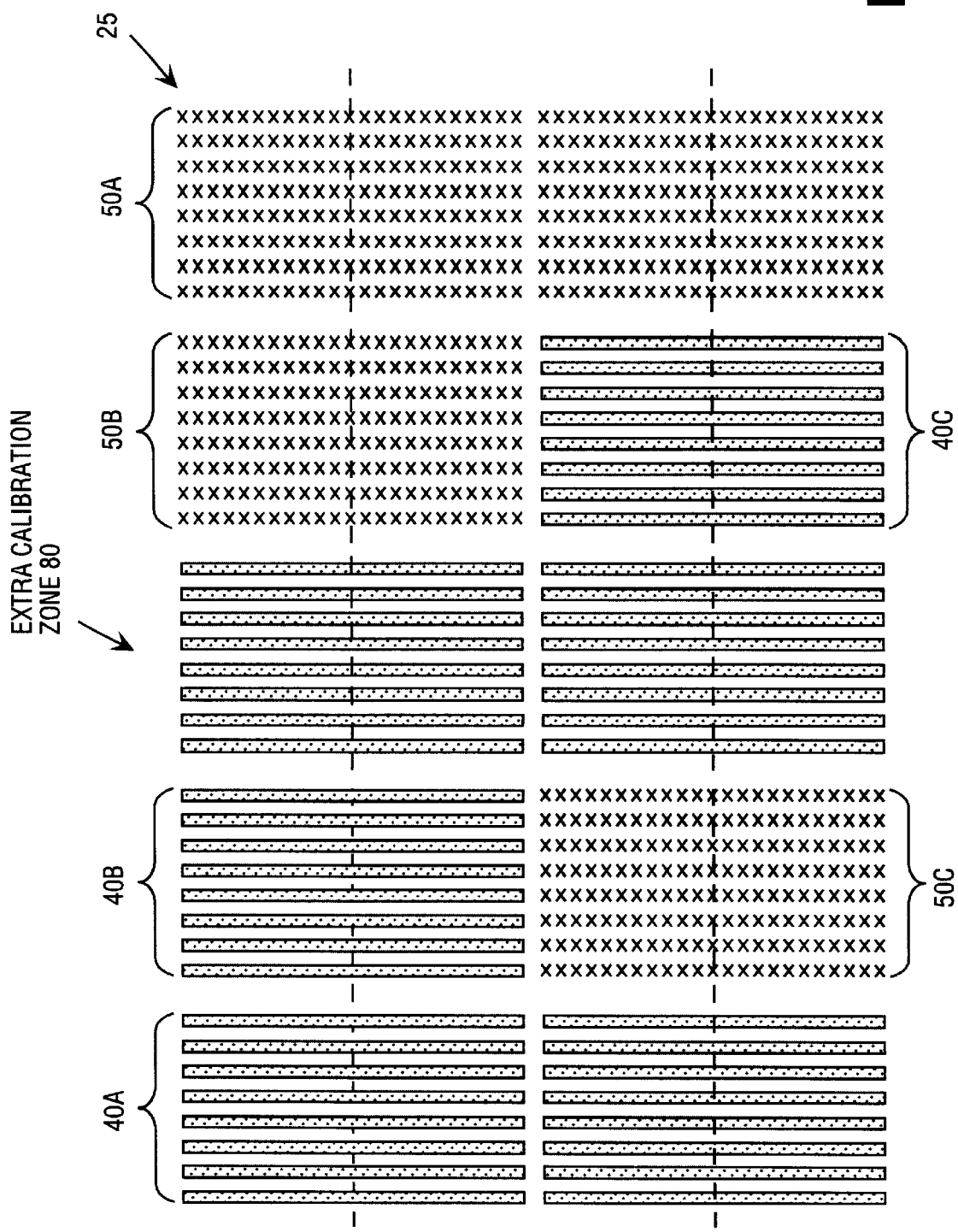
FIG. 6 illustrates an alternative embodiment of the mark which includes a third calibration segment.

FIG. 6 illustrates an alignment pattern according to an alternative embodiment of the invention. In the alignment pattern 25, a third calibration segment 80 is formed on the second layer of wafer 100 and is positioned between the two test segments. The calibration segment 80 may also be formed on the first layer of the wafer. The third calibration segment may be utilized to increase the amount of test data available to be averaged. This may further minimize the effect of offset errors between the wafer layers and the alignment scanner.

While this invention has been described in terms of several preferred embodiments, there are alteration, permutations, and equivalents which fall within the scope of this invention. It should also be noted that there are many alternative ways of implementing the methods and apparatuses of the present invention. For example, although the illustrated mark structures include calibration line sets, of course, the calibration lines may be excluded from the mark and a calibration procedure may be eliminated. It is therefore intended that the following appended claims be interpreted as including all such alterations, permutations, and equivalents as fall within the true spirit and scope of the present invention.

We claim:

1. A mark for use in measuring the relative position between a first layer and a second layer of a device wherein the second layer is formed above the first layer, the mark comprising:
    a first set of calibration periodic structures positioned along an axis and formed on the first layer of the device; and
    at least two sets of test periodic structures also positioned along the axis, each set of test periodic structures including a first section and a second section, the first section containing test periodic structures formed on the first layer and the second section containing test periodic structures formed on the second layer, the first section and second section of each set being positioned proximate to the second section and first section, respectively, of the next set of test periodic structures.

2. The mark as recited in claim 1 wherein the test periodic structures of the first layer are visible through the second layer.

3. The mark as recited in claim 1 further comprising:
    a second set of calibration periodic structures, each of the second set of calibration periodic structures formed on the same layer of the device,
    wherein the sets of test periodic structures are positioned between the first and second set of calibration periodic structures.

4. The mark as recited in claim 3 wherein there are two sets of test periodic structures.

5. The mark as recited in claim 3 wherein the first set of calibration periodic structures is formed on the first layer and the second set of calibration periodic structures is formed on the second layer.

6. The mark as recited in claim 1 wherein each of the calibration and test periodic structures are line segments having substantially uniform width, m, each of the line segments within the set of calibration and test periodic structures being substantially adjacent to and substantially parallel to each other, the line segments within each set being separated by a substantially uniform distance, n.

7. The mark as recited in claim 6 wherein the width m and the distance n have a fixed ratio relationship with respect to each other.

8. The mark as recited in claim 6 wherein the width m and the distance n are substantially equal to each other.

9. The mark as recited in claim 6 wherein the first set of calibration periodic structures and the first section of one of the sets of test periodic structures is separated by distance n.

10. The mark as recited in claim 1 further comprising a third set of calibration periodic structures positioned along the axis and between two sets of test periodic structures.

11. A mark for use in measuring an alignment between a first layer and a second layer of a semiconductor device, the mark comprising:
    a first set of periodic test structures positioned along a first scan path, the first set of periodic test structures having a first section formed from the first layer and a second section formed from the second layer; and
    a second set of periodic test structures positioned along a second scan path, the second set of periodic test structures having a first section formed from the first layer and a second section formed from the second layer,
    the first section and the second section of the first set of periodic test structures being proximate to the second section and the first section, respectively, of the second set of periodic test structures.

12. The mark as recited in claim 11 wherein the first set of periodic test structures and the second set of periodic test structures are exposed to facilitate measurements thereon.

13. A method for measuring the relative position between a first layer and a second layer of a device wherein the second layer is formed above the first layer, the method comprising:

provi ding a first set of calibration periodic structures on each the first and second layer of the device along a first axis and in an orientation to facilitate the measurement of the relative position between the two layers in the first direction;

providing at least two first sets of test periodic structures along the first axis and proximate to and in the same orientation with the first sets of calibration periodic structures to facilitate measurement of the relative position between the two layers in the first direction, each first set of test periodic structures including a first section and a second section, the first section containing test periodic structures formed on the first layer and the second section containing test periodic structures formed on the second layer, the first section and second section of each set being positioned proximate to the second section and the first section, respectively, of the next set of test periodic structures along the first axis;

scanning a beam in a first path across portions of the first sets of calibration periodic structures and the first sets of test periodic structures, wherein at least a portion of the beam reflects off the surface of the device after the beam impinges upon the device;

scanning a beam in a second path across portions of the first sets of calibration periodic structures and the first sets of test periodic structures wherein the first and second paths are physically separated from each other, also wherein at least a portion of the beam reflects off the surface of the device after the beam impinges upon the device;

generating a first signal proportional to an intensity of the reflected portion of the beam from the first path;

generating a second signal proportional to an intensity of the reflected portion of the beam from the second path;

calculating any first registration error between the two layers in the first direction based on the first signal and the second signal such that differences between the first and second signal that are caused by differences between characteristics of the first and second layer are minimized.

14. The method as recited in claim 13 wherein the calculating of the relative position between the first layer and the second layer in the first direction, is performed by adjusting the first registration error by a system-wafer offset value.

15. The method as recited in claim 13 wherein the test periodic structures of the first layer are visible through the second layer.

16. The method as recited in claim 13 wherein each of the calibration and test periodic structures are line segments having substantially uniform width, m, each of the line segments within the set of calibration and test periodic structures being substantially adjacent to and substantially parallel to each other, the line segments within each set being separated by a substantially uniform distance, n.

17. The method as recited in claim 16 wherein the width m and the distance n have a fixed ratio relationship with respect to each other.

18. The method as recited in claim 16 wherein the width m and the distance n are substantially equal to each other.

19. The method as recited in claim 16 wherein there are two first sets of test periodic structures, the two sets of test periodic structures positioned between the set of calibration periodic structures on the first layer and the set of calibration periodic structures on the second layer.

20. The method as recited in claim 19 wherein the sets of calibration periodic structures and the sets of the test periodic structures are separated by distance n.

21. The method of claim 13 wherein the scanning of the first path and the second path are substantially parallel to each other.

22. The method as recited in claim 13 wherein the scanning of the first path and the second path are performed sequentially.

23. The method as recited in claim 13 wherein the scanning of the first path and the second path are performed simultaneously.

24. The method as recited in claim 13 further comprising:

providing a second set of calibration periodic structures on each the first and second layer of the device along a second axis and in an orientation to facilitate the measurement of the relative position between the two layers in a second direction;

providing at least two second sets of test periodic structures along the second axis and proximate to and in the same orientation with the second sets of calibration periodic structures to facilitate measurement of the relative position between the two layers in the second direction, each second set of test periodic structures including a first section and a second section, the first section containing test periodic structures formed on the first layer and the second section containing test periodic structures formed on the second layer, the first section and second section of each set being positioned proximate to the second section and the first section, respectively, of the next set of test periodic structures along the second axis;

scanning a beam in a third path across portions of the second sets of calibration periodic structures and the second sets of test periodic structures, wherein at least a portion of the beam reflects off the surface of the device after the beam impinges upon the device;

scanning a beam in a fourth path across portions of the second sets of calibration periodic structures and the second sets of test periodic structures wherein the third and fourth paths are physically separated from each other, also wherein at least a portion of the beam reflects off the surface of the device after the beam impinges upon the device;

generating a third signal proportional to an intensity of the reflected portion of the beam from the third path;

generating a fourth signal proportional to an intensity of the reflected portion of the beam from the fourth path;

calculating any second registration error between the two layers in the second direction based on the third signal and the fourth signal such that differences between the third and fourth signal that are caused by differences between characteristics of the third and fourth layer are minimized.

25. The method as recited in claim 24 wherein the calculating of the relative position between the first layer and the second layer in the second direction, is performed by adjusting the second registration error by a system-wafer offset value.

26. The method as recited in claim 24 wherein the test periodic structures of the first layer are visible through the second layer.

27. The method as recited in claim 24 wherein the first and second directions are substantially perpendicular to each other.

28. The method as recited in claim 13 wherein the scanning operations are performed optically.

29. The method as recited in claim 13 wherein the scanning operations are performed with an electron beam.

30. The method as recited in claim 13 wherein the scanning and detecting operations are performed during the process of fabricating a semiconductor wafer.

31. A method for measuring alignment of a first layer to a second layer of a semiconductor device, the method comprising:

in a first path, scanning a first measurement beam across a first set of periodic test structures having a first section formed from the first layer and a second section formed from the second layer;

in a second path, scanning a second measurement beam across a second set of periodic test structures having a first section formed from the first layer and a second section formed from the second layer, the first section and the second section of the first set of periodic test structures being proximate to the second section and the first section, respectively, of the second set of periodic test structures; and determining an alignment value between first and second layers based on a first signal received in response to the first measurement beam and a second signal received in response to the second measurement beam such that differences between the first signal and the second signal that are caused by differences between characteristics of the first and second layer are minimized.

32. The method for measuring as recited in claim 31 wherein the alignment value is determined by calculating an average phase difference between the first and second signals whereby differences between characteristics of the first and second layers cancel each other out.

* * * * *